US012660557B2

(12) United States Patent
Honda

(10) Patent No.: US 12,660,557 B2
(45) Date of Patent: *Jun. 16, 2026

(54) SUBSTRATE PROCESSING APPARATUS AND SUBSTRATE PROCESSING METHOD

(71) Applicant: Tokyo Electron Limited, Tokyo (JP)

(72) Inventor: Takumi Honda, Koshi City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 324 days.

This patent is subject to a terminal disclaimer.

(21) Appl. No.: 18/456,765

(22) Filed: Aug. 28, 2023

(65) Prior Publication Data

US 2024/0071794 A1 Feb. 29, 2024

(30) Foreign Application Priority Data

Aug. 30, 2022 (JP) ................................. 2022-136570

(51) Int. Cl.
  *H10P 72/00* (2026.01)
  *H10P 50/28* (2026.01)
  *H10P 74/00* (2026.01)

(52) U.S. Cl.
  CPC ........ *H10P 72/0604* (2026.01); *H10P 50/283* (2026.01); *H10P 72/0426* (2026.01); *H10P 74/23* (2026.01)

(58) Field of Classification Search
  CPC ......... H01L 21/31111; H01L 21/67057; H01L 21/67086; H01L 21/67173; H01L 21/67253; H01L 22/20; H10P 50/283; H10P 72/0416; H10P 72/0426; H10P 72/0456; H10P 72/0604; H10P 74/23
  See application file for complete search history.

(56) References Cited

U.S. PATENT DOCUMENTS

2018/0301345 A1*  10/2018  Sato ...................... H10P 50/283
2019/0206695 A1*   7/2019  Koyama ............... H10P 50/283
2020/0194286 A1*   6/2020  Yoshida .............. H10P 72/0426
2020/0227290 A1*   7/2020  Kimura ............... H10P 72/0426

FOREIGN PATENT DOCUMENTS

JP        4966223  B2    7/2012

* cited by examiner

*Primary Examiner* — Benjamin Kendall
(74) *Attorney, Agent, or Firm* — Chrisman Gallo Tochtrop LLC

(57) ABSTRACT

A substrate processing apparatus includes a substrate processing unit and a controller. The substrate processing unit is configured to perform an etching processing on one or more substrates each having a silicon nitride film and a silicon oxide film on a surface thereof with a processing liquid containing a phosphoric acid aqueous solution and a silicic acid compound. The controller is configured to control individual components of the substrate processing apparatus. The controller includes a correction unit configured to correct a phosphoric acid concentration of the processing liquid such that etching selectivity of the silicon nitride film with respect to the silicon oxide film becomes constant at a given value from a beginning of the etching processing to an end thereof.

13 Claims, 8 Drawing Sheets

SUBSTRATE PROCESSING APPARATUS AND SUBSTRATE PROCESSING METHOD

CROSS-REFERENCE TO RELATED APPLICATION

This application claims the benefit of Japanese Patent Application No. 2022-136570 filed on Aug. 30, 2022, the entire disclosure of which is incorporated herein by reference.

TECHNICAL FIELD

The various aspects and embodiments described herein pertain generally to a substrate processing apparatus and a substrate processing method.

BACKGROUND

Conventionally, in a substrate processing system, there is known a technique of selectively etching, between a silicon nitride film and a silicon oxide film formed on a substrate, the silicon nitride film by using an etching liquid containing a phosphoric acid aqueous solution (see Patent Document 1).

Patent Document 1: Japanese Patent No. 4,966,223

SUMMARY

In one exemplary embodiment, a substrate processing apparatus includes a substrate processing unit and a controller. The substrate processing unit is configured to perform an etching processing on one or more substrates each having a silicon nitride film and a silicon oxide film on a surface thereof with a processing liquid containing a phosphoric acid aqueous solution and a silicic acid compound. The controller is configured to control individual components of the substrate processing apparatus. The controller includes a correction unit configured to correct a phosphoric acid concentration of the processing liquid such that etching selectivity of the silicon nitride film with respect to the silicon oxide film becomes constant at a given value from a beginning of the etching processing to an end thereof.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 1 is a schematic block diagram illustrating a configuration of a substrate processing system according to an exemplary embodiment;

FIG. 9A and FIG. 9B are diagrams showing an example of a concentration transition line of a silicic acid compound and a concentration transition curve of phosphoric acid calculated by the calculation unit;

DETAILED DESCRIPTION

Figure 2:
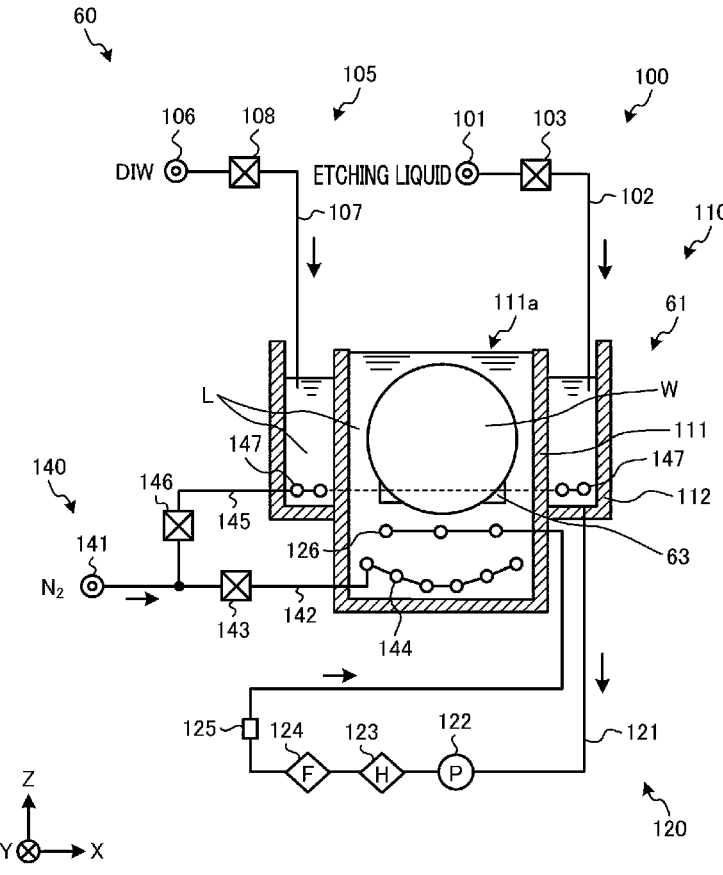
FIG. 2 is a schematic block diagram illustrating a configuration of an etching apparatus according to the exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing method and a substrate processing apparatus of the present disclosure will be described in detail with reference to the accompanying drawings. The present disclosure is not limited to the exemplary embodiments to be described below. Further, it should be noted that the drawings are schematic and relations in sizes of individual components and ratios of the individual components may sometimes be different from actual values. Even between the drawings, there may exist parts having different dimensional relationships or different ratios.

Conventionally, in a substrate processing system, there is known a technique of selectively etching, among a silicon nitride film and a silicon oxide film formed on a substrate, the silicon nitride film by using an etching liquid containing a phosphoric acid aqueous solution. In such a prior art, a plurality of substrates can be etched collectively by immersing the plurality of substrates in an etching liquid stored in a processing tub all at once, for example.

Meanwhile, in the above prior art, in order to maintain constant the concentration of a silicic acid compound (hereinafter also referred to as "silicic acid concentration") contained in the etching liquid, it is necessary to constantly supply the etching liquid with a low silicic acid concentration into the processing tub. As a result, the consumption amount of the etching liquid in the etching processing increases.

In this regard, there is a demand for a technique capable of solving the aforementioned problem and thus capable of reducing the amount of use of the etching liquid in the technique of etching the substrate by using the etching liquid containing the phosphoric acid aqueous solution.

<Configuration of Substrate Processing System>

Figure 1:
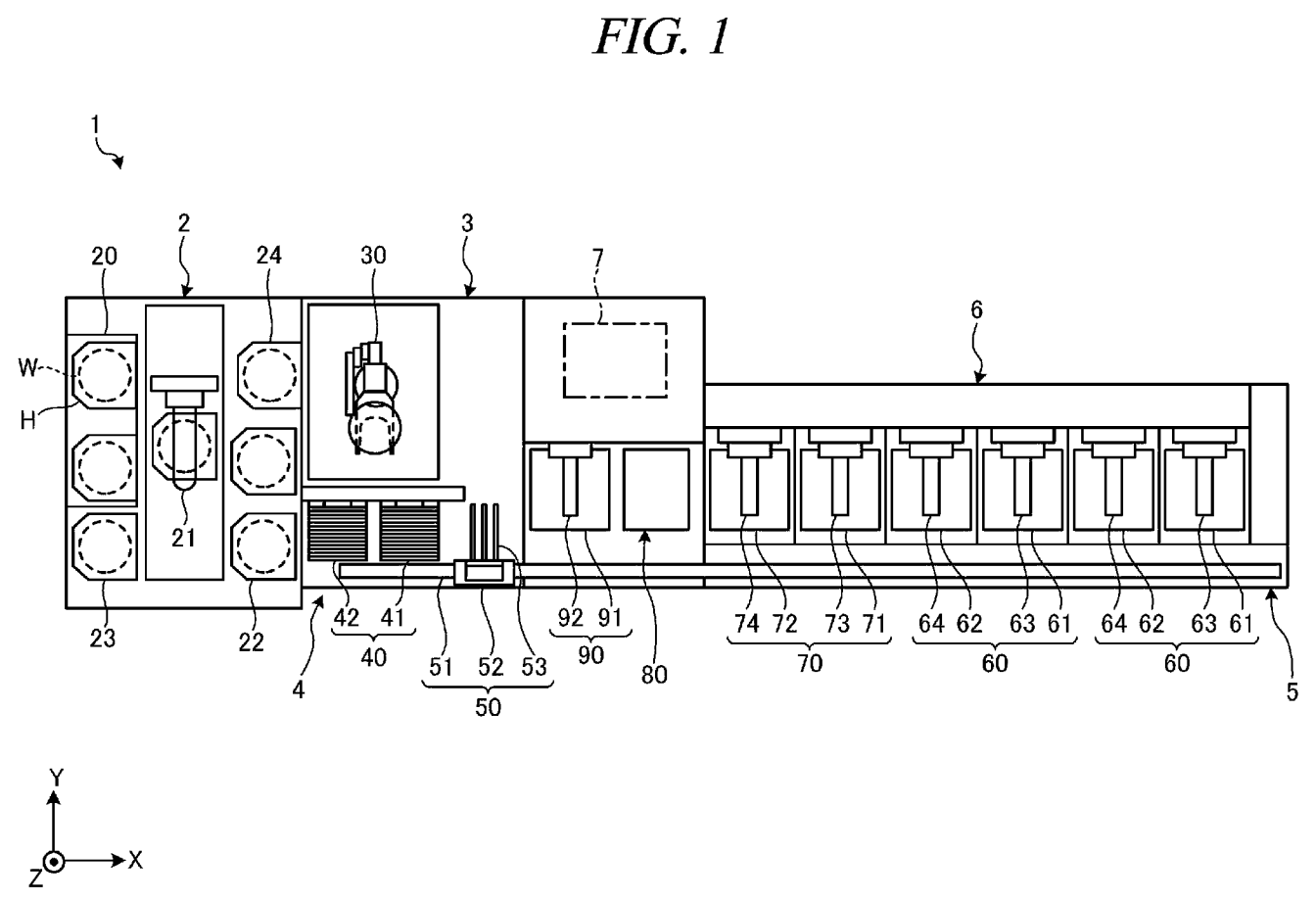

First, a configuration of a substrate processing system 1 according to an exemplary embodiment will be described with reference to FIG. 1. FIG. 1 is a schematic block diagram illustrating the configuration of the substrate processing system 1 according to the exemplary embodiment. The substrate processing system 1 is an example of a substrate processing apparatus.

As depicted in FIG. 1, the substrate processing system 1 is equipped with a carrier carry-in/out unit 2, a lot forming unit 3, a lot placing unit 4, a lot transferring unit 5, a lot processing unit 6, and a control device 7.

The carrier carry-in/out unit 2 is equipped with a carrier stage 20, a carrier transfer mechanism 21, carrier stocks 22 and 23, and a carrier placing table 24.

The carrier stage 20 places thereon a plurality of FOUPs H transferred from the outside. Each FOUP is a container configured to accommodate a plurality (e.g., twenty five sheets) of wafers W therein while allowing the wafers to be vertically arranged in a horizontal posture. The carrier transfer device 21 transfers the FOUPs between the carrier stage 20, the carrier stocks 22 and 23, and the carrier placing table 24.

A plurality of wafers W before being processed is carried out from the FOUP H placed on the carrier placing table 24 into the lot processing unit 6 by a substrate transfer mechanism 30 to be described later. Further, a plurality of wafers W after being processed is carried into the FOUP H placed on the carrier placing table 24 from the lot processing unit 6 by the substrate transfer mechanism 30.

The lot forming unit 3 is equipped with the substrate transfer mechanism 30 to form a lot. The lot is formed of a plurality (e.g., fifty sheets) of wafers W to be processed simultaneously by combining wafers W accommodated in one or more FOUPs H. The wafers W belonging to the single lot are arranged with their plate surfaces facing each other at a predetermined distance therebetween.

The substrate transfer mechanism 30 transfers the wafers W between the FOUP H placed on the carrier placing table 24 and the lot placing unit 4.

The lot placing unit 4 is equipped with a lot placing table 40 to temporarily place (stand by) a lot to be transferred between the lot forming unit 3 and the lot processing unit 6 by the lot transferring unit 5. The lot placing table 40 is equipped with a carry-in side lot placing table 41 on which a lot before being processed, which is formed by the lot forming unit 3, is placed; and a carry-out side lot placing table 42 on which a lot after being processed by the lot processing unit 6 is placed. On the carry-in side lot placing table 41 and the carry-out side lot placing table 42, the plurality of wafers W corresponding to a single lot are arranged side by side in an upright posture.

The lot transferring unit 5 is equipped with a lot transferring mechanism 50 to transfer the lot between the lot placing unit 4 and the lot processing unit 6 or within the lot processing unit 6. The lot transferring mechanism 50 is equipped with a rail 51, a moving body 52 and a substrate holder 53.

The rail 51 is disposed along the X-axis direction across the lot placing unit 4 and the lot processing unit 6. The moving body 52 is configured to be movable along the rail 51 while holding the plurality of wafers W. The substrate holder 53 is provided on the moving body 52 to hold the plurality of wafers W arranged side by side in the upright posture.

The lot processing unit 6 performs an etching processing, a cleaning processing, a drying processing, and the like on the plurality of wafers W belonging to the single lot at once. In the lot processing unit 6, two etching apparatuses 60, a cleaning apparatus 70, a cleaning apparatus 80, and a drying apparatus 90 are arranged along the rail 51.

The etching apparatus 60 is configured to perform an etching processing on the plurality of wafers W corresponding to the single lot at once. The cleaning apparatus 70 is configured to perform a cleaning processing on the plurality of wafers W corresponding to the single lot at once. The cleaning apparatus 80 is configured to perform a cleaning processing on the substrate holder 53. The drying apparatus 90 is configured to perform a drying processing on the plurality of wafers W corresponding to the single lot at once. Here, the number of the etching apparatuses 60, the cleaning apparatus 70, the cleaning apparatus 80 and the drying apparatus 90 is not limited to the example shown in FIG. 1.

Each of the etching apparatuses 60 includes a processing tub 61 for etching, a processing tub 62 for rinsing, and substrate elevating mechanisms 63 and 64.

The processing tub 61 is capable of accommodating therein the wafers W for the single lot arranged in the upright posture, and store therein a chemical liquid for etching (hereinafter, also referred to as "etching liquid"). Details of the processing tub 61 will be elaborated below.

The processing tub 62 stores a processing liquid for rinsing (deionized water or the like) therein. In each of the substrate elevating mechanisms 63 and 64, the plurality of wafers W belonging to the lot are held while being arranged side by side in the upright posture.

The etching apparatus 60 holds, with the substrate elevating mechanism 63, the lot transferred by the lot transferring unit 5, and performs the etching processing by immersing the lot in an etching liquid L in the processing tub 61. The etching processing is performed for, e.g., about 1 hour to about 3 hours.

The lot after being etched in the processing tub 61 is transferred by the lot transferring unit 5 to the processing tub 62. Then, the etching apparatus 60 holds the transferred lot with the substrate elevating mechanism 64, and performs a rinsing processing by immersing the lot in a rinsing liquid in the processing tub 62. The lot after being rinsed in the processing tub 62 is transferred by the lot transferring unit 5 to a processing tub 71 of the cleaning apparatus 70.

The cleaning apparatus 70 is equipped with the processing tub 71 for cleaning, a processing tub 72 for rinsing, and substrate elevating mechanisms 73 and 74. The processing tub 71 for cleaning stores therein a chemical liquid for cleaning (hereinafter, also referred to as "cleaning chemical liquid"). The cleaning chemical liquid may be, by way of non-limiting example, SC-1 (a mixed solution of ammonia, hydrogen peroxide and water).

The processing tub 72 for rinsing stores therein a processing liquid for rinsing (deionized water or the like). In each of the substrate elevating mechanisms 73 and 74, the wafers W belonging to the single lot are held while being arranged side by side in the upright posture.

The cleaning apparatus 70 holds, with the substrate elevating mechanism 73, the lot transferred by the lot transferring unit 5, and performs the cleaning processing by immersing the lot in the cleaning liquid in the processing tub 71.

The lot after being cleaned in the processing tub 71 is transferred by the lot transferring unit 5 to the processing tub 72. Then, the cleaning apparatus 70 holds the transferred lot with the substrate elevating mechanism 74, and performs a rinsing processing by immersing the lot in the rinsing liquid in the processing tub 72. The lot after being rinsed in the processing tub 72 is transferred by the lot transferring unit 5 to a processing tub 91 of the drying apparatus 90.

The drying apparatus 90 includes the processing tub 91 and a substrate elevating mechanism 92. The processing tub 91 is supplied with a processing gas for drying. In the substrate elevating mechanism 92, the wafers W belonging to the single lot are held while being arranged side by side in the upright posture.

The drying apparatus 90 holds, with the substrate elevating mechanism 92, the lot transferred by the lot transferring unit 5, and performs the drying processing with the processing gas for drying supplied into the processing tub 91. The lot after being dried in the processing tub 91 is transferred by the lot transferring unit 5 to the lot placing unit 4.

The cleaning apparatus 80 performs the cleaning processing on the substrate holder 53 by supplying a processing liquid for cleaning to the substrate holder 53 of the lot transferring mechanism 50 and, also, by supplying a drying gas.

The control device 7 controls operations of the individual components (the carrier carry-in/out unit 2, the lot forming unit 3, the lot placing unit 4, the lot transferring unit 5, the lot processing unit 6, and so forth) of the substrate processing system 1. The control device 7 controls the operations of the individual components of the substrate processing system 1 based on signals from a switch or various sensors.

The control device 7 includes a microcomputer having a CPU (Central Processing Unit), a ROM (Read Only Memory), a RAM (Random Access Memory), input/output ports, and the like, and various kinds of circuits. For example, the control device 7 controls the operation of the substrate processing system 1 by reading and executing a program stored in a storage 8 (see FIG. 3). Details of this control device 7 will be discussed later.

<Configuration of Etching Apparatus>

Now, a configuration of the etching apparatus 60 configured to perform the etching processing on the wafer W will be explained with reference to FIG. 2. FIG. 2 is a schematic block diagram illustrating the configuration of the etching apparatus 60 according to the exemplary embodiment.

The etching apparatus 60 includes an etching liquid supply 100, a DIW supply 105, and a substrate processing unit 110. The etching liquid supply 100 supplies the etching liquid L to the substrate processing unit 110. The etching liquid L is an example of the processing liquid.

The etching liquid supply 100 is equipped with an etching liquid source 101, an etching liquid supply path 102, and a flow rate controller 103.

The etching liquid source 101 is, for example, a tank that stores the etching liquid L therein. The etching liquid L according to the exemplary embodiment contains a phosphoric acid ($H_3PO_4$) aqueous solution. Further, in the present disclosure, the phosphoric acid aqueous solution is also simply referred to as "phosphoric acid". Further, the etching liquid L according to the exemplary embodiment may contain a silicic acid compound (hereinafter, simply referred to as "silicic acid").

In the etching liquid L according to the exemplary embodiment, the silicic acid compound can be added by, for example, a solution in which colloidal silicon is dispersed.

The etching liquid supply path 102 connects the etching liquid source 101 to an outer tub 112 of the processing but 61, and supplies the etching liquid L from the etching liquid source 101 to the outer tub 112.

The flow rate controller 103 is disposed in the etching liquid supply path 102, and controls the flow rate of the etching liquid L supplied to the outer tub 112. The flow rate controller 103 has an opening/closing valve, a flow rate control valve, a flowmeter, and so forth.

The DIW supply 105 supplies the DIW (Deionized water) to the substrate processing unit 110, whereby the concentration of the phosphoric acid aqueous solution (hereinafter, also referred to as "phosphoric acid concentration") of the etching liquid L stored in the processing tub 61 can be adjusted.

The DIW supply 105 is equipped with a DIW source 106, a DIW supply path 107, and a flow rate controller 108.

The DIW source 106 is, for example, a tank that stores the DIW therein. The DIW supply path 107 connects the DIW source 106 to the outer tub 112 of the processing tub 61, and supplies the DIW from the DIW source 106 to the outer tub 112.

The flow rate controller 108 is disposed in the DIW supply path 107, and controls the flow rate of the DIW supplied to the outer tub 112. The flow rate controller 108 has an opening/closing valve, a flow rate control valve, a flowmeter, and so forth.

The substrate processing unit 110 performs the etching processing on the wafer W by immersing the wafer W in the etching liquid L supplied from the etching liquid supply 100. The wafer W is an example of the substrate. In the exemplary embodiment, among the silicon nitride film and the silicon oxide film formed on the wafer W, the silicon nitride film can be selectively etched, for example.

The substrate processing unit 110 is equipped with the processing tub 61, the substrate elevating mechanism 63, an etching liquid circulation unit 120, and a gas supply 140. The processing tub 61 has an inner tub 111 and the outer tub 112.

The inner tub 111 is a water tank for immersing the wafer W in the etching liquid L, and stores therein the etching liquid L for immersion. The inner tub 111 has an opening 111a at the top thereof, and the etching liquid L is stored up to the vicinity of the opening 111a.

In the inner tub 111, the plurality of wafers W are immersed in the etching liquid L by using the substrate elevating mechanism 63, so that the etching processing is performed on the wafers W. The substrate elevating mechanism 63 is configured to be movable up and down, and holds the plurality of wafers W while arranging them side by side in the upright posture.

The outer tub 112 is disposed outside the inner tub 111 so as to surround the inner tub 111 when viewed from the top, and serves to receive the etching liquid L flowing out from the opening 111a of the inner tub 111. As depicted in FIG. 2, the liquid level of the outer tub 112 is kept lower than that of the inner tub 111.

The etching liquid circulation unit 120 circulates the etching liquid L between the inner tub 111 and the outer tub 112. The etching liquid circulation unit 120 includes a circulation path 121, a pump 122, a heater 123, a filter 124, a concentration sensor 125, and a plurality of (three in the drawing) processing liquid nozzles 126.

The circulation path 121 connects the outer tub 112 and the inner tub 111. One end of the circulation path 121 is connected to a bottom portion of the outer tub 112, and the other end of the circulation path 121 is connected to the processing liquid nozzle 126 located in the inner tub 111. The pump 122, the heater 123, the filter 124, and the concentration sensor 125 are located in the circulation path 121 in sequence from the outer tub 112 side.

The pump 122 forms a circulation flow of the etching liquid L sent from the outer tub 112 to the inner tub 111 via the circulation path 121. Further, the etching liquid L flows out into the outer tub 112 again by overflowing from the opening 111a of the inner tub 111. In this way, the circulation flow of the etching liquid L is formed in the substrate processing unit 110. That is, this circulation flow is formed through the outer tub 112, the circulation path 121, and the inner tub 111.

The heater 123 adjusts the temperature of the etching liquid L circulating through the circulation path 121. The filter 124 filters the etching liquid L circulating through the circulation path 121. The concentration sensor 125 measures the phosphoric acid concentration of the etching liquid L stored in the processing tub 61 by measuring the phosphoric acid concentration in the etching liquid L circulating through the circulation path 121. A signal generated by the concentration sensor 125 is transmitted to a controller 9.

The processing liquid nozzle 126 discharges the etching liquid L circulating in the circulation path 121 upwards in the inner tub 111 to form an upward flow in the inner tub 111.

The gas supply 140 supplies an inert gas (for example, a nitrogen gas) to a bottom portion of the inner tub 111 and the bottom portion of the outer tub 112 where the etching liquid L is stored. As a result, bubbles of the inert gas are discharged into the bottom portions of the inner tub 111 and the outer tub 112.

The gas supply 140 includes a gas source 141, a gas supply path 142, a flow rate controller 143, a plurality of gas nozzles 144, a gas supply path 145, a flow rate controller 146, and a plurality of gas nozzles 147.

The gas supply path 142 connects the gas source 141 to the plurality of gas nozzles 144 to supply the inert gas from the gas source 141 to the plurality of gas nozzles 144.

The flow rate controller 143 is disposed in the gas supply path 142 and adjusts the supply amount of the inert gas supplied to the plurality of gas nozzles 144. The flow rate controller 143 has an opening/closing valve, a flow rate control valve, a flowmeter, and so forth.

The plurality of gas nozzles 144 are arranged in multiple rows (six rows in the drawing) below the wafer W and the processing liquid nozzle 126 in the inner tub 111, for example. The plurality of gas nozzles 144 discharge the bubbles of the inert gas upwards to the etching liquid L stored in the inner tub 111 to form the upward flow inside the inner tub 111.

The gas supply path 145 connects the gas source 141 to the plurality of gas nozzles 147 to supply the inert gas from the gas source 141 to the plurality of gas nozzles 147.

The flow rate controller 146 is disposed in the gas supply path 145, and adjusts the supply amount of the inert gas supplied to the plurality of gas nozzles 147. The flow rate controller 146 has an opening/closing valve, a flow rate control valve, a flowmeter, and so forth.

The plurality of gas nozzles 147 are arranged in multiple rows (two rows in the drawing) along the four sides of the inner tub 111 when viewed from the top at the bottom portion of the outer tub 112, for example. The plurality of gas nozzles 147 discharge the bubbles of the inert gas upwards to the etching liquid L stored in the outer tub 112 to form an upward flow inside the outer tub 112.

In the etching apparatus 60 according to the exemplary embodiment, by discharging the bubbles of the inert gas from the plurality of gas nozzles 144, a fast flow of the etching liquid L can be supplied into the gaps between the plurality of wafers W arranged side by side in the inner tub 111. Therefore, according to the exemplary embodiment, the plurality of wafers W can be efficiently and uniformly etched.

Further, in the etching apparatus 60 according to the exemplary embodiment, by discharging the bubbles of the inert gas from the plurality of gas nozzles 144, evaporation of the etching liquid L stored in the inner tub 111 can be accelerated.

Further, in the etching apparatus 60 according to the exemplary embodiment, by discharging the bubbles of the inert gas from the plurality of gas nozzles 147, evaporation of the etching liquid L stored in the outer tub 112 can be accelerated.

Exemplary Embodiment

Figure 3:
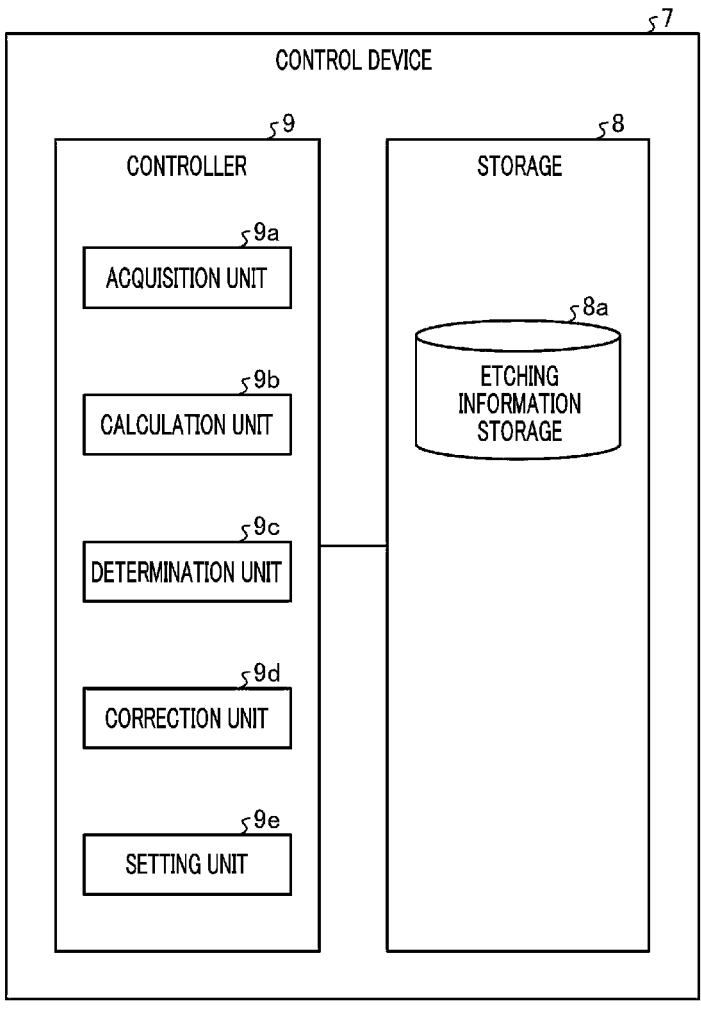
FIG. 3 is a block diagram illustrating a configuration of a control device according to the exemplary embodiment.

Now, details of the etching processing according to the exemplary embodiment will be explained with reference to FIG. 3 to FIG. 11. FIG. 3 is a block diagram illustrating a configuration of the control device 7 according to the exemplary embodiment. As depicted in FIG. 3, the control device 7 is equipped with the storage 8 and the controller 9.

In addition to the functional components shown in FIG. 3, the control device 7 may also have various commonly known functional components of computers, such as various input devices and audio output devices.

The storage 8 is implemented by, for example, a semiconductor memory device such as a RAM or a flash memory, or a storage device such as a hard disk or an optical disk. The storage 8 has an etching information storage 8a. Further, the storage 8 stores information used for a processing in the controller 9.

The etching information storage 8a stores therein various types of data indicating a relationship between a phosphoric acid concentration and a silicic acid concentration of the etching liquid L and etching rates of the silicon oxide film and the silicon nitride film in the etching liquid L having these concentrations. Details of the data stored in the etching information storage 8a will be described with reference to FIG. 4 to FIG. 7.

Figure 4:
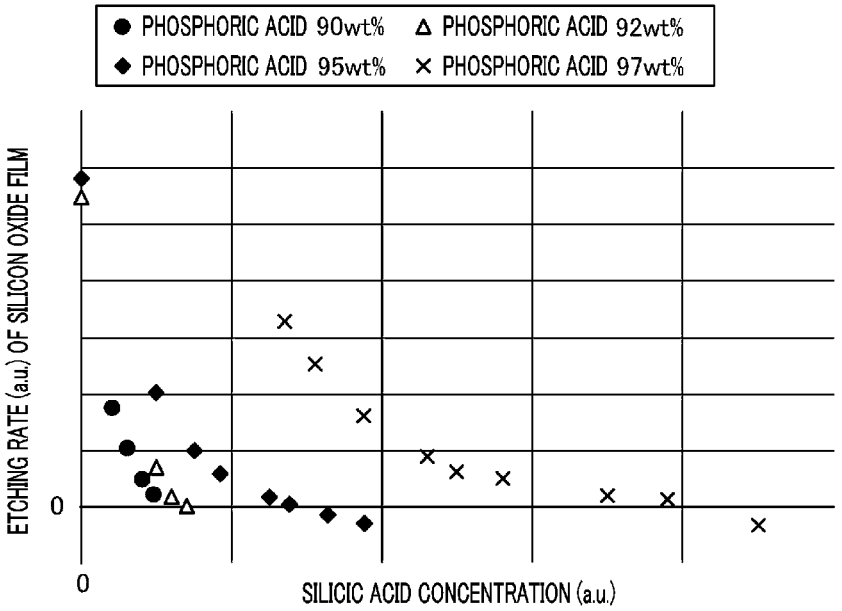
FIG. 4 is a diagram showing an example of a relationship between a silicic acid concentration and an etching rate of a silicon oxide film in cases of different phosphoric acid concentrations.

FIG. 4 is a diagram showing an example of a relationship between a silicic acid concentration and an etching rate of the silicon oxide film at a plurality of phosphoric acid concentrations. As shown in FIG. 4, in the etching processing according to the exemplary embodiment, in all cases of the phosphoric acid concentrations, the lower the silicic acid concentration of the etching liquid L is, the higher the etching rate of the silicon oxide film may be.

That is, in the etching processing according to the exemplary embodiment, in all cases of the phosphoric acid concentrations, the etching rate of the silicon oxide film gradually decreases as the silicic acid concentration of the etching liquid L increases. If the silicon acid concentration exceeds a certain threshold, the etching rate becomes a negative value.

In this way, the fact that the etching rate of the silicon oxide film becomes the negative value indicates that the silicon oxide film of the wafer W is not etched in the etching processing and the silicon oxide film is deposited instead.

Furthermore, in the etching processing according to the exemplary embodiment, as the phosphoric acid concentration of the etching liquid L increases, the rate of decrease of the etching rate with respect to the increase of the silicic acid concentration gradually decreases, and the threshold value of the silicic acid concentration at which the etching rate becomes the negative value gradually rises.

Figure 5:
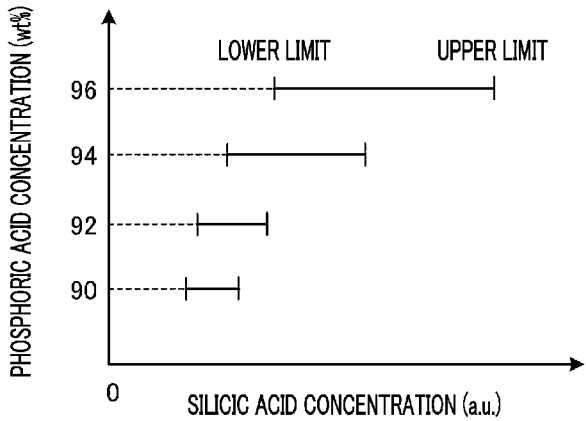
FIG. 5 is a schematic diagram showing upper limits and lower limits of the silicic acid concentration in the cases of different phosphoric acid concentrations.

Then, based on measurement results shown in FIG. 4, the controller 9 (see FIG. 3) may acquire data as shown in FIG. 5. FIG. 5 is a schematic diagram showing upper limits and lower limits of the silicic acid concentration in cases of different phosphoric acid concentrations.

As depicted in FIG. 5, in the etching processing according to the exemplary embodiment, in each case of the phosphoric acid concentration in the etching liquid L, there exist an upper limit and a lower limit of the silicic acid concentration. The lower limit of the silicic acid concentration corresponds to a case where the etching rate of the silicon oxide film is a certain positive value in the results shown in FIG. 4, for example.

When the etching rate of the silicon oxide film exceeds the certain positive value, etching selectivity of the silicon nitride film with respect to the silicon oxide film cannot be maintained at a required ratio (for example, 1000:1 or 2000:1). As a result, the etching processing may not be carried out in a required way.

For this reason, in the etching processing according to the exemplary embodiment, the lower limit of the silicic acid concentration is set for each phosphoric acid concentration.

Further, the upper limit of the silicic acid concentration corresponds to a case where the etching rate of the silicon oxide film is less than zero in the results shown in FIG. 4, for example. When the etching rate of the silicon oxide film is a negative value, the required etching processing becomes difficult to carry out because the silicon oxide film is deposited on the wafer W during the etching processing.

For this reason, in the etching processing according to the exemplary embodiment, the upper limit of the silicic acid concentration is set for each phosphoric acid concentration.

Then, as shown in FIG. 5, in the etching processing according to the exemplary embodiment, as the phosphoric acid concentration of the etching liquid L increases, a margin (hereinafter, also referred to as "regrowth margin") between the lower limit and the upper limit of the silicic acid concentration gradually widens.

This indicates that, in the etching processing according to the exemplary embodiment, as the phosphoric acid concentration of the etching liquid L increases, the tolerance range of the silicic acid concentration gradually widens.

Figure 6:
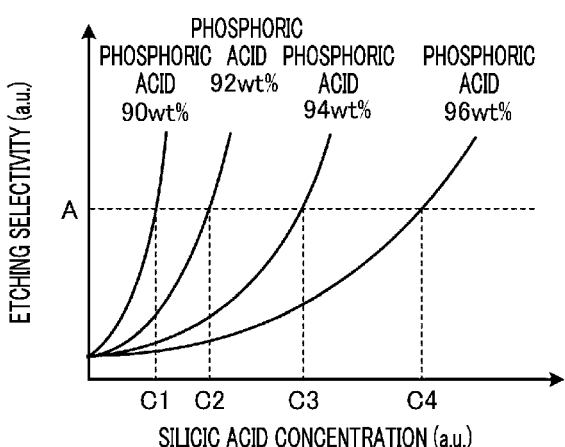
FIG. 6 is a schematic diagram showing a relationship between the silicic acid concentration and etching selectivity in the cases of the different phosphoric acid concentrations.

FIG. 6 is a schematic diagram showing a relationship between the silicic acid concentration and the etching selectivity in the cases of the different phosphoric acid concentrations. In the following drawings, and the like, the term "a value of the etching selectivity" refers to a value of the etching rate of the silicon nitride film when the etching rate of the silicon oxide film is set to 1.

As depicted in FIG. 6, in the etching processing according to the exemplary embodiment, in all cases of the phosphoric acid concentrations, the etching selectivity gradually increases with a rise of the silicic acid concentration of the etching liquid L.

Further, in the etching processing according to the exemplary embodiment, as the phosphoric acid concentration of the etching liquid L increases, the rate of increase of the etching rate with respect to the increase of the silicic acid concentration gradually becomes moderate.

As a result, as shown in FIG. 6, in the etching processing according to the exemplary embodiment, the value of the silicic acid concentration at which a required value A (e.g., 1000 or 2000) of the etching selectivity is obtained rises gradually as the phosphoric acid concentration of the etching liquid L increases.

Figure 7:
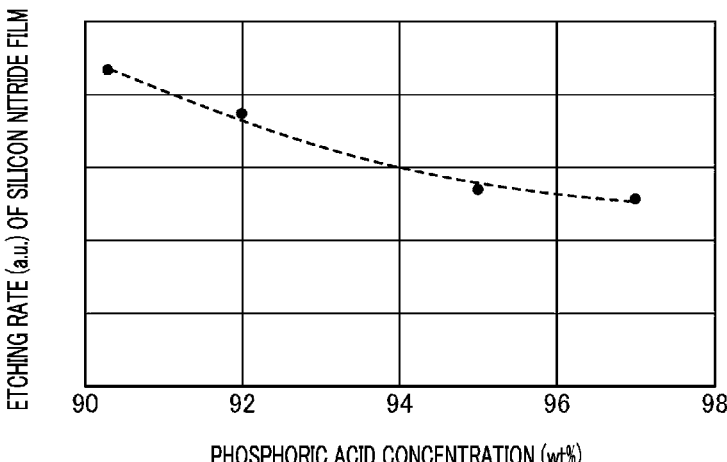
FIG. 7 is a diagram showing an example of a relationship between a phosphoric acid concentration and an etching rate of a silicon nitride film.

FIG. 7 is a diagram showing a relationship between the phosphoric acid concentration and the etching rate of the silicon nitride film. As depicted in FIG. 7, in the etching processing according to the exemplary embodiment, the etching rate of the silicon nitride film gradually decreases with a rise of the phosphoric acid concentration of the etching liquid L.

This indicates that, in the etching processing according to the exemplary embodiment, as the phosphoric acid concentration of the etching liquid L increases, a processing time taken to complete the required etching processing becomes longer.

The data shown in FIG. 4 to FIG. 7 can be acquired by measuring the etching rates of the silicon oxide film and the silicon nitride film for multiple types of etching liquids L having different phosphoric acid concentrations and different silicic acid concentrations, for example. The acquired various types of data are stored in the etching information storage 8a of the storage 8 in advance.

Reference is made back to FIG. 3. The controller 9 is implemented by, for example, a CPU, a MPU (Micro Processing Unit), a GPU (Graphics Processing Unit), or the like that serves to execute the program stored in the storage 8 by using a RAM as a work area.

Further, the controller 9 may be implemented by an integrated circuit such as, but not limited to, an ASIC (Application Specific Integrated Circuit) or a FPGA (Field Programmable Gate Array).

The controller 9 includes an acquisition unit 9a, a calculation unit 9b, a determination unit 9c, a correction unit 9d, and a setting unit 9e, and realizes or carries out functions and operations of a control processing to be described below. In addition, the internal configuration of the controller 9 is not limited to that shown in FIG. 3, and any of various other configurations may be adopted as long as the controller 9 is capable of performing the control processing to be described later.

The acquisition unit 9a is configured to acquire formation states of silicon nitride films and silicon oxide films in a plurality of wafers W to be subjected to the etching processing. The acquisition unit 9a acquires the formation states of the silicon nitride films and the silicon oxide films in the plurality of wafers W based on, for example, a lot ID of the FOUP H (see FIG. 1).

The lot ID of the FOUP H is stored in advance in, for example, the storage 8 or an external storage device (not shown).

By way of example, the acquisition unit 9a acquires film thicknesses and numbers of stacked layers of the silicon nitride films and the silicon oxide films formed on the plurality of wafers W as the formation states of the silicon nitride films and the silicon oxide films formed in the plurality of wafers W. Further, the acquisition unit 9a also acquires the number of wafers W to be subjected to the etching processing next based on, for example of, the lot ID of the FOUP H.

Figure 8:
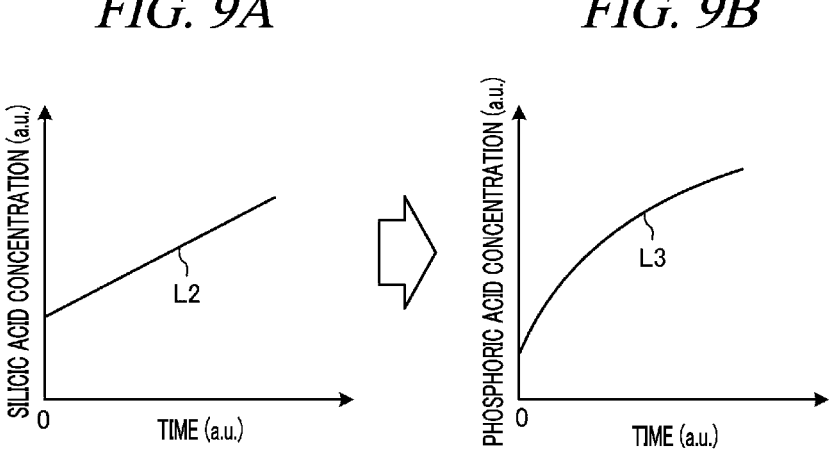
FIG. 8 is a diagram for describing a concentration correlation curve of an etching liquid calculated by a calculation unit.

The calculation unit 9*b* is configured to perform various calculation processings. Details of theses calculation processings will be described with reference to FIG. 8 to FIG. 10B. FIG. 8 is a diagram for describing a concentration correlation curve L1 of the etching liquid L obtained by the calculation unit 9*b*.

As shown in FIG. 8, this concentration correlation curve L1 is a curve representing a correlation between the silicic acid concentration and the phosphoric acid concentration when the etching selectivity of the silicon nitride film with respect to the silicon oxide film is of the required desired value A (see FIG. 6).

The calculation unit 9*b* first acquires values of the phosphoric acid concentration and values of the silicic acid concentration of the etching liquid L when the etching selectivity is of the required value A, based on the data as shown in FIG. 6 stored in the etching information storage 8*a*.

Then, the calculation unit 9*b* plots the acquired values of the phosphoric acid concentration and the silicic acid concentration on an XY plane, as shown in FIG. 8 (here, see points P1 to point P4). Finally, the calculation unit 9*b* calculates an approximation curve passing through the plurality of points (for example, the points P1 to P4) plotted on the XY plane as the concentration correlation curve L1.

Therefore, the correlation between the silicic acid concentration and the phosphoric acid concentration in the etching liquid L when the etching selectivity is of the required value A can be clarified.

In addition, the calculation unit 9*b* calculates a time course of the silicic acid concentration in the etching processing of the plurality of wafers W based on the formation states of the silicon nitride films and the silicon oxide films in the plurality of wafers W acquired by the acquisition unit 9*a*.

FIG. 9A and FIG. 9B are diagrams illustrating an example of a concentration transition line L2 of the silicic acid compound and a concentration transition curve L3 of the phosphoric acid calculated by the calculation unit 9*b*. Further, the examples of FIG. 9A and FIG. 9B represent a case where the number of the wafers W accommodated in the single FOUP H (see FIG. 1) is relatively small, or where the number of stacked layers of the silicon nitride films and the silicon oxide films formed on the wafer W is relatively small.

In this case, since the amount of the silicon oxide film eluted per unit time from all of the plurality of wafers W is relatively small, the rate of increase of the silicic acid concentration in the etching liquid L during the etching processing is relatively gentle, as can be seen from the concentration transition line L2 of the silicon acid compound shown in FIG. 9A.

Then, based on the concentration correlation curve L1 (see FIG. 8) calculated as described above and the concentration transition line L2 of the silicic acid compound, the calculation unit 9*b* calculates a time course of the phosphoric acid concentration in the etching processing of the plurality of wafers W.

Specifically, the calculation unit 9*b* calculates the time course of the phosphoric acid concentration by converting the silicic acid concentration of the concentration correlation curve L1 into time through the use of the data of the concentration transition line L2 of the silicic acid compound. As a result, the concentration transition curve L3 of the phosphoric acid as shown in FIG. 9B is obtained.

Figures 10A, 10B:
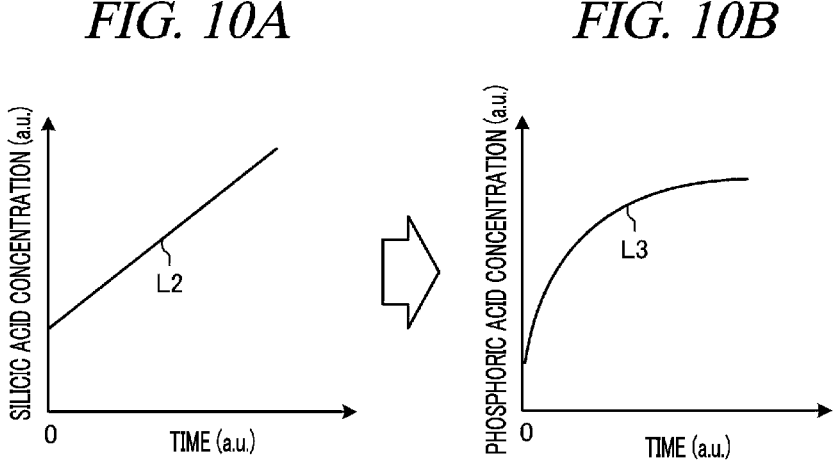
FIG. 10A and FIG. 10B are diagram showing another example of the concentration transition line of the silicic acid compound and the concentration transition curve of the phosphoric acid calculated by the calculation unit.

FIG. 10A and FIG. 10B are diagrams illustrating another example of the concentration transition line L2 of the silicic acid compound and the concentration transition curve L3 of the phosphoric acid calculated by the calculation unit 9*b*. The examples of FIG. 10A and FIG. 10B represent a case where the number of the wafers W accommodated in the single FOUP H (see FIG. 1) is large, or where the number of stacked layers of the silicon nitride films and the silicon oxide films formed on the wafer W is large.

In this case, since the amount of the silicon oxide film eluted per unit time from all of the plurality of wafers W increases, the rate of increase of the silicic acid concentration in the etching liquid L during the etching processing becomes large, as indicated by the concentration transition line L2 of the silicon acid compound shown in FIG. 9A.

Then, based on the concentration correlation curve L1 (see FIG. 8) calculated as described above and the concentration transition line L2 of the silicic acid compound, the calculation unit 9*b* calculates the time course of the phosphoric acid concentration in the etching processing of the plurality of wafers W. As a result, the concentration transition curve L3 of the phosphoric acid as shown in FIG. 10B is obtained.

The concentration transition curve L3 of the phosphoric acid calculated as described above indicates the change in the phosphoric acid concentration enabling the plurality of wafers W scheduled to be subjected to the etching processing to be continuously etched with the required value A of the etching selectively in the whole period from the beginning of the etching processing to the end thereof.

Reference is made back to FIG. 3. The determination unit 9*c* is configured to determine whether or not the etching processing in which the etching selectivity becomes constant at the given value A (see FIG. 6) is possible from the beginning of the etching processing until the end thereof. Specifically, the determination unit 9*c* determines whether or not the increase of the phosphoric acid concentration indicated by the concentration transition curve L3 (see FIG. 9B) of the phosphoric acid calculated as described above can be achieved in the processing tub 61.

For example, when the increase of the phosphoric acid concentration indicated by the concentration transition curve L3 of the phosphoric acid can be achieved in the processing tub 61 by operating the gas supply 140 to accelerate the evaporation of the etching liquid L stored in the processing tub 61, the determination unit 9*c* makes a determination that such an increase of the phosphoric acid concentration is possible.

Meanwhile, when the increase of the phosphoric acid concentration indicated by the concentration transition curve L3 of the phosphoric acid cannot be achieved in the processing tub 61 even when the evaporation of the etching liquid L stored in the processing tub 61 is accelerated by operating the gas supply 140, the determination unit 9*c* makes a determination that such an increase of the phosphoric acid concentration is not possible.

The correction unit 9*d* is configured to correct the phosphoric acid concentration of the etching liquid L so that the etching selectivity becomes constant at the given value A from the beginning of the etching processing to the end thereof.

For example, when it is determined that the increase of the phosphoric acid concentration indicated by the concentration transition curve L3 of the phosphoric acid can be achieved in the processing tub 61, the correction unit 9*d* corrects the phosphoric acid concentration of the etching liquid L according to the concentration transition curve L3 of the phosphoric acid from the beginning of the etching processing until the end thereof.

Accordingly, in the etching processing of the plurality of wafers W, even when the silicic acid concentration of the etching liquid L gradually increases, the etching processing can be performed at stable etching selectivity without needing to replenish the etching liquid L.

Therefore, according to the exemplary embodiment, in the technique of etching the wafer W by using the etching liquid L containing the phosphoric acid, the consumption amount of the etching liquid L can be reduced.

Further, in the exemplary embodiment, when the etching processing of the plurality of wafers W is performed based on the concentration transition curve L3 of the phosphoric acid, the correction unit 9d may correct the phosphoric acid concentration of the etching liquid L based on a measurement result of the concentration sensor 125 (see FIG. 2).

As a result, since the concentration transition curve L3 of the phosphoric acid can be traced with high precision during the etching processing, the etching processing of the plurality of wafers W can be carried out with high precision.

In addition, an etching time from the start to the end of a single cycle of the etching processing is determined based on, for example, the phosphoric acid concentration of the etching liquid L at the time of starting the etching processing and the etching rate of the silicon nitride film shown in FIG. 7.

Figure 11:
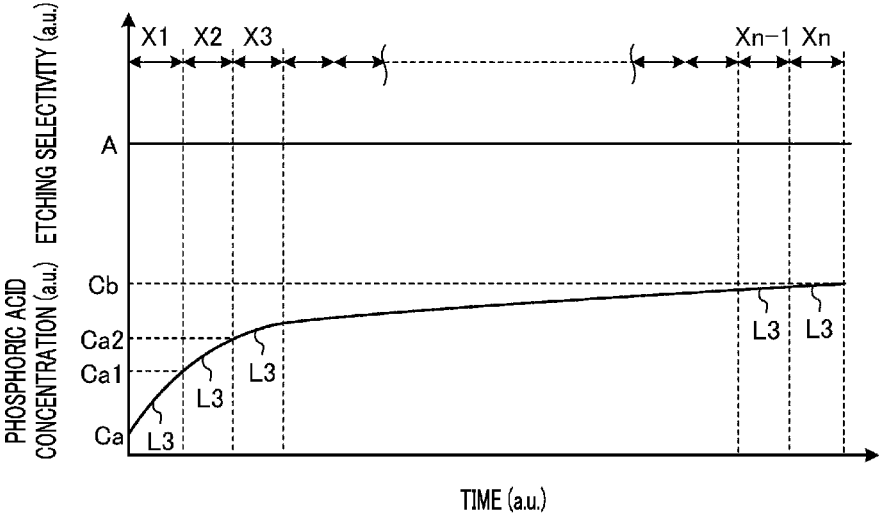
FIG. 11 is a diagram showing an example of time courses of a phosphoric acid concentration of an etching liquid and etching selectivity in an etching processing according to the exemplary embodiment.

FIG. 11 is a diagram showing an example of time courses of the phosphoric acid concentration of the etching liquid L and the etching selectivity in the etching processing according to the exemplary embodiment.

As depicted in FIG. 11, in the etching processing according to the exemplary embodiment, replacement of the etching liquid L is performed in the processing tub 61, and the phosphoric acid concentration of the etching liquid L is set to a preset initial concentration Ca (for example, about 85 wt % to 90 wt %). At this time, the temperature of the etching liquid L is set to, e.g., 150° C. to 170° C.

Then, the correction unit 9d (see FIG. 3) performs an etching processing X1 of a first plurality of wafers W (first etching processing X1) (see FIG. 1) after the replacement to the new liquid based on the film formation state of the first plurality of wafers W and the concentration transition curve L3 of the phosphoric acid calculated based on the initial concentration Ca of the phosphoric acid.

Next, the correction unit 9d performs an etching processing X2 of a second plurality of wafers W (second etching processing X2) based on the film formation state of the second plurality of wafers W and the concentration transition curve L3 of the phosphoric acid calculated based on a phosphoric acid concentration Ca1 at the end of the first etching processing X1.

Subsequently, the correction unit 9d performs an etching processing X3 of a third plurality of wafers W based on the film formation state of the third plurality of wafers W and the concentration transition curve L3 of the phosphoric acid calculated based on a phosphoric acid concentration Ca2 at the end of the second etching processing X2.

In this way, in the exemplary embodiment, a batch processing of a multiple number of wafers W can be repeatedly performed by using the same etching liquid L.

Then, the correction unit 9d performs an etching processing Xn of the n-th plurality of wafers W (n-th etching processing Xn) based on the film formation state of the n-th plurality of wafers W and the concentration transition curve L3 of the phosphoric acid calculated based on a phosphoric acid concentration at the end of the (n−1)th etching processing Xn−1.

Further, in the exemplary embodiment, when the phosphoric acid concentration of the etching liquid L in the processing tub 61 reaches an upper limit concentration Cb (for example, about 98 w %) at the end of the n-th etching processing Xn, the replacement of the etching liquid L is performed in the processing tub 61.

Moreover, in the etching processing according to the exemplary embodiment, since all the etching processings X1 to Xn are performed based on the concentration transition curve L3 of the phosphoric acid, the etching selectivity becomes constant at the required value A in all of the etching processings X1 to Xn, as shown in FIG. 11.

In this way, in the exemplary embodiment, even when the silicic acid concentration of the etching liquid L gradually increases in the multiple etching processings X1 to Xn, the etching processing can be performed at stable etching selectivity without needing to replenish the etching liquid L.

Therefore, according to the exemplary embodiment, in the technique of etching the wafer W by using the etching liquid L containing the phosphoric acid, the consumption amount of the etching liquid L can be reduced.

Further, in the exemplary embodiment, when the same etching liquid L is continuously used as illustrated in FIG. 11, the correction unit 9d needs to gradually increase the phosphoric acid concentration of the etching liquid L so that the etching selectivity becomes constant.

As a result, since the etching processing can be performed at stable etching selectivity without needing to replenish the etching liquid L, the consumption amount of the etching liquid L can be reduced.

Furthermore, in the exemplary embodiment, as a way to gradually increase the phosphoric acid concentration of the etching liquid L, the gas supply 140 may be operated to accelerate the evaporation of the etching liquid L. Accordingly, the phosphoric acid concentration of the etching liquid L can be gradually increased by a simple manner.

Further, in the exemplary embodiment, when performing the correction of the phosphoric acid concentration based on the concentration transition curve L3 of the phosphoric acid, the correction unit 9d may supply the DIW from the DIW supply 105 into the processing tub 61 when it is required to suppress the increase of the phosphoric acid concentration of the etching liquid L. Therefore, the rise of the phosphoric acid concentration of the etching liquid L can be suppressed by a simple manner.

Reference is made back to FIG. 3. When it is determined by the determination unit 9c that the etching processing in which the etching selectivity becomes constant at the given value A from the beginning of the etching processing until the end thereof is not possible, the setting unit 9e sets a new phosphoric acid concentration of the etching liquid L.

This new phosphoric acid concentration is higher than the phosphoric acid concentration at that time point, and is of a value that enables the etching processing in which the etching selectivity becomes constant at the given value A from the beginning of the etching processing until the end thereof. Further, the setting unit 9e is configured to adjust the phosphoric acid concentration of the etching liquid L stored in the processing tub 61 to the newly set value of the phosphoric acid concentration.

As described above, in the exemplary embodiment, even when the evaporation accelerating ability of the processing tub 61 is not sufficient and the next etching processing cannot be performed with the required etching selectivity in that state, as the setting unit 9e sets the new phosphoric acid concentration, the next etching processing can be performed successfully.

That is, in the exemplary embodiment, even when the evaporation accelerating ability of the processing tub 61 is not sufficient and the next etching processing cannot be performed with the required etching selectivity in that state, there is no need to replace the etching liquid L of the processing tub 61, so that the consumption amount of the etching liquid L can be reduced.

Moreover, in the exemplary embodiment, the gas nozzle 147 may be disposed not only in the inner tub 111 but also in the outer tub 112. With this configuration, since the evaporation of the etching liquid L stored in the processing tub 61 can be further accelerated, the increase of the phosphoric acid concentration indicated by the concentration transition curve L3 of the phosphoric acid can be achieved in the wide range.

Therefore, according to the exemplary embodiment, since resetting of the phosphoric acid concentration can be suppressed, more wafers W can be processed before the replacement of the etching liquid L, so that the consumption amount of etching liquid L can be further reduced.

Further, in the exemplary embodiment, the value A of the etching selectivity may be any value. Thus, the etching processing of the exemplary embodiment can be performed with various values of etching selectivity according to user's needs.

Further, the above exemplary embodiment has been described for the example where the technique of the present disclosure is applied to the batch processing of processing the plurality of wafers W at once. However, the present disclosure is not limited to this example. For example, the technique of the present disclosure may also be applied to a single-wafer processing in which the wafers W are etched one by one.

In this case, a recycling mechanism configured to reuse the etching liquid L once used in the etching processing may be provided in a single-wafer processing unit, and the above-described technique may be applied to this recycling mechanism.

In addition, in the technique of the present disclosure, a silicic acid concentration sensor configured to measure the silicic acid concentration of the etching liquid L stored in the processing tub 61 may be additionally provided, and the phosphoric acid concentration of the etching liquid L may be controlled based on the measurement value of the silicic acid concentration sensor and the concentration correlation curve L1 shown in FIG. 8.

In this way as well, since the etching processing can be performed at stable etching selectivity without having to replenish the etching liquid L, the consumption amount of the etching liquid L can be reduced.

The substrate processing apparatus (substrate processing system 1) according to the exemplary embodiment includes the substrate processing unit 110 and the controller 9. The substrate processing unit 110 performs an etching processing on one or more substrates (wafers W) each having a silicon nitride film and a silicon oxide film formed on a surface thereof with a processing liquid (etching liquid L) containing a phosphoric acid aqueous solution and a silicic acid compound. The controller 9 controls the individual components of the substrate processing apparatus. Further, the controller 9 has the correction unit 9d. The correction unit 9d corrects the phosphoric acid concentration of the processing liquid (etching liquid L) such that the etching selectivity of the silicon nitride film with respect to the silicon oxide film is maintained constant at the given value A in a period from the beginning of the etching processing to the end thereof. Accordingly, in the technique of etching the wafer W by using the etching liquid L containing the phosphoric acid aqueous solution, the consumption amount of the etching liquid L can be reduced.

Further, the substrate processing apparatus (substrate processing system 1) according to the exemplary embodiment further includes the concentration sensor 125 configured to measure the phosphoric acid concentration of the processing liquid (etching liquid L). The correction unit 9d corrects the phosphoric acid concentration of the processing liquid (etching liquid L) based on the measurement result of the concentration sensor 125. Thus, the etching processing of the wafer W can be performed with high precision.

Furthermore, in the substrate processing apparatus (substrate processing system 1) according to the exemplary embodiment, the correction unit 9d corrects the phosphoric acid concentration of the processing liquid based on data (concentration correlation curve L1) indicating the relationship between the phosphoric acid concentration and the silicic acid concentration in the processing liquid when the etching selectivity is of the given value A. Thus, the etching processing of the wafer W can be performed with high precision.

In addition, in the substrate processing apparatus (substrate processing system 1) according to the exemplary embodiment, the given value A is any value. Thus, the etching processing of the exemplary embodiment can be performed with various values of etching selectivity according to the user's demand.

Besides, in the substrate processing apparatus (substrate processing system 1) according to the exemplary embodiment, when the processing liquid (etching liquid L) is continuously used, the correction unit 9d gradually increases the phosphoric acid concentration of the processing liquid (etching liquid L) such that the etching selectivity becomes a constant value. Therefore, the consumption amount of the etching liquid L can be reduced.

In the substrate processing apparatus (substrate processing system 1) according to the exemplary embodiment, the substrate processing unit 110 includes the inner tub 111, the outer tub 112, and the gas supply 140. The inner tub 111 has the opening 111a at the top thereof, and the processing liquid (etching liquid L) is stored in the inner tub 111, and the one or more substrates (wafers W) are immersed in the inner tub 111. The outer tub 112 is disposed outside the inner tub 111 to receive the processing liquid (etching liquid L) flowing out from the opening 111a. The gas supply 140 supplies an inert gas to the bottom portions of the inner tub 111 and the outer tub 112. Further, the correction unit 9d gradually increases the phosphoric acid concentration of the processing liquid (etching liquid L) by controlling the amount of the inert gas supplied to at least one of the inner tub 111 or the outer tub 112. Thus, the phosphoric acid concentration of the etching liquid L can be gradually increased in a simple way.

Further, in the substrate processing apparatus (substrate processing system 1) according to the exemplary embodiment, the controller 9 has the determination unit 9c. The determination unit 9c determines whether or not the etching processing in which the etching selectivity is maintained constant at the given value A from the beginning of the etching processing to the end thereof is allowed to be performed. In addition, the determination unit 9c makes the determination based on the phosphoric acid concentration and the silicic acid concentration of the processing liquid in the inner tub 111 at the time when the etching processing is started, the formation states of the silicon nitride film and the silicon oxide film in each of the one or more substrates, and the amount of the inert gas allowed to be supplied from the gas supply 140. As a result, even when the evaporation accelerating ability of the processing tub 61 is not sufficient and the next etching processing cannot be performed at the required etching selectivity in that state, the next etching processing can still be performed without any problem by performing the processing of resetting the phosphoric acid concentration by the setting unit 9e.

Further, in the substrate processing apparatus (substrate processing system 1) according to the exemplary embodiment, the controller 9 has the setting unit 9e. The setting unit 9e sets a new phosphoric acid concentration allowing the etching processing in which the etching selectivity is maintained constant at the given value A from the beginning of the etching processing to the end thereof. In addition, when it is determined by the determination unit 9c that the etching processing in which the etching selectivity is maintained constant at the given value from the beginning of the etching processing to the end thereof is not allowed to be performed, the setting unit 9e sets a new phosphoric acid concentration. As a result, even if the evaporation accelerating ability of the processing tub 61 is not sufficient and the next etching processing cannot be performed at the required etching selectivity in that state, the next etching processing can still be performed without any problem.

Furthermore, in the substrate processing apparatus (substrate processing system 1) according to the exemplary embodiment, the controller 9 has the acquisition unit 9a. The acquisition unit 9a obtains the formation states of the silicon nitride film and the silicon oxide film in each of the one or more substrates (wafers W) based on the lot ID of the FOUP H having a processing recipe on the one or more substrates (wafers W) and a number of the one or more substrates. Thus, the etching processing of the wafers W can be performed with high precision.

<Sequence of Control Processing>

Figure 12:
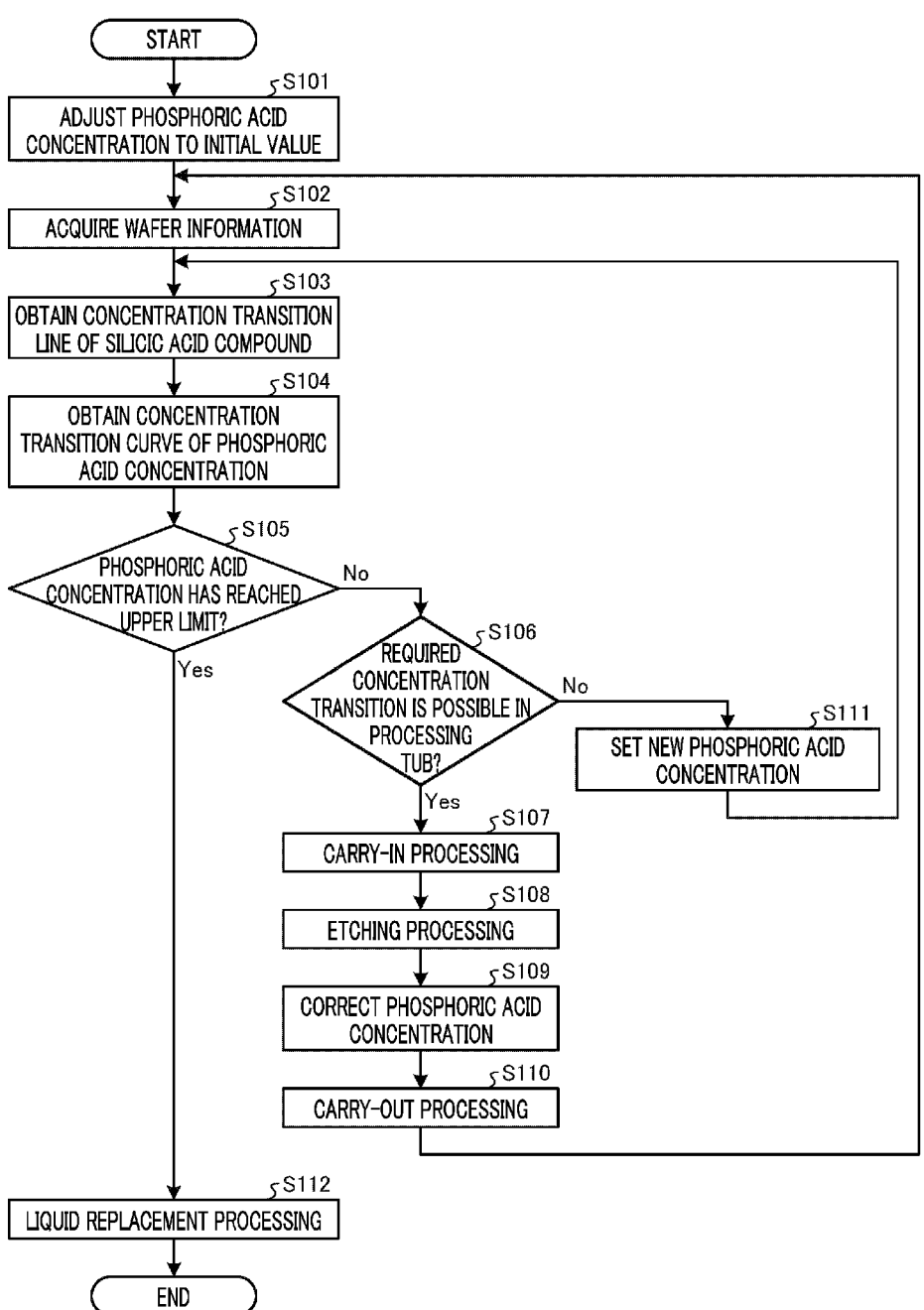
FIG. 12 is a flowchart illustrating an example sequence of a control processing performed by the substrate processing system according to the exemplary embodiment.

Now, the sequence of the control processing according to the exemplary embodiment will be described with reference to FIG. 12. FIG. 12 is a flowchart showing an example of the sequence of the control processing performed by the substrate processing system 1 according to the exemplary embodiment.

In the control processing according to the exemplary embodiment, first, the controller 9 adjusts the phosphoric acid concentration of the replaced etching liquid L in the processing tub 61 to the initial value (initial concentration Ca) (see FIG. 11) (process S101).

Next, the controller 9 acquires, based on the lot ID of the FOUP H, the wafer information of the plurality of wafers W accommodated in the FOUP H and scheduled to be subjected to the etching processing next (process S102). In this process S102, the number of the wafers W to be subjected to the next etching processing, the formation states of the silicon nitride film and the silicon oxide film in each of the plurality of wafers W, and the like are acquired.

Thereafter, the controller 9 calculates the concentration transition line L2 of the silicic acid compound in the next etching processing based on the acquired wafer information of the wafers W (process S103). Then, the controller 9 calculates the concentration transition curve L3 of the phosphoric acid concentration in the next etching processing based on the calculated concentration transition line L2 of the silicic acid compound (process S104).

Subsequently, the controller 9 determines whether or not the phosphoric acid concentration reaches the given upper limit on the calculated concentration transition curve L3 of the phosphoric acid (process S105). Then, when it is determined that the phosphoric acid concentration does not reach the upper limit of the given value (process S105, No), the controller 9 determines that the concentration transition of the phosphoric acid indicated by the calculated concentration transition curve L3 of the phosphoric acid is possible in the processing tub 61 (process S106).

Then, when it is determined that the concentration transition of the phosphoric acid represented by the concentration transition curve L3 of the phosphoric acid is possible in the processing tub 61 (process S106, Yes), the controller 9 carries the plurality of wafers W into the inner tub 111 of the processing tub 61 collectively (process S107). Then, the controller 9 performs the etching processing on the plurality of wafers W all at once in the processing tub 61 (process S108).

Next, the controller 9 corrects the phosphoric acid concentration of the etching liquid L during the etching processing based on the concentration transition curve L3 of the phosphoric acid calculated in the process S104 (process S109). Then, the controller 9 carries out the plurality of wafers W finished with the etching processing from the processing tub 61 (process S110), and the processing returns back to the process S102.

Meanwhile, when it is determined that the concentration transition of the phosphoric acid indicated by the concentration transition curve L3 of the phosphoric acid is not possible in the processing tub 61 (process S106, No), the controller 9 sets the new phosphoric acid concentration of the etching liquid L in the processing tub 61 (process S111). Then, the processing returns back to the process S103.

Further, in the process S105 described above, when it is determined that the concentration of the phosphoric acid reaches the upper limit of the given value (process S105, Yes), the etching liquid L in the processing tub 61 is replaced with the new liquid (process S112), and the substrate processing including the series of processes is finally ended.

The substrate processing method according to the exemplary embodiment includes etching one or more substrates (process S108) and correcting a phosphoric acid concentration of the processing liquid (process S109). In the etching of the one or more substrates (process S108), the one or more substrates (wafer W) each having a silicon nitride film and a silicon oxide film formed on a surface thereof are etched with a processing liquid (etching liquid L) containing phosphoric acid and a silicic acid compound. In the correcting of the phosphoric acid concentration of the processing liquid (process S109), the phosphoric acid concentration of the processing liquid (etching liquid L) is corrected such that the etching selectivity of the silicon nitride film with respect to the silicon oxide film is maintained constant at the given value A from the beginning of the etching processing to the end thereof. Therefore, in the technique of etching the wafers W by using the etching liquid L containing a phosphoric acid aqueous solution, the consumption amount of the etching liquid L can be reduced.

So far, the exemplary embodiment of the present disclosure has been described. However, the present disclosure is not limited to the above-described exemplary embodiment, and various changes and modifications may be made without departing from the spirit of the present disclosure.

Here, it should be noted that the above-described exemplary embodiments are illustrative in all aspects and are not anyway limiting. In fact, the above-described exemplary embodiments can be embodied in various forms. Further, the above-described exemplary embodiments may be omitted, replaced and modified in various ways without departing from the scope and the spirit of claims.

According to the exemplary embodiment, it is possible to reduce the consumption amount of the etching liquid in the technique of etching the substrate by using the etching liquid containing the phosphoric acid aqueous solution.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing apparatus, comprising:
a substrate processing unit configured to perform an etching processing on one or more substrates each having a silicon nitride film and a silicon oxide film on a surface thereof with a processing liquid containing phosphoric acid and a silicic acid compound; and
a controller configured to control individual components of the substrate processing apparatus,
wherein the controller comprises a correction unit configured to correct a phosphoric acid concentration of the processing liquid such that etching selectivity of the silicon nitride film with respect to the silicon oxide film becomes constant at a given value from a beginning of the etching processing to an end thereof.

2. The substrate processing apparatus of claim 1, further comprising:
a concentration sensor configured to measure the phosphoric acid concentration of the processing liquid,
wherein the correction unit corrects the phosphoric acid concentration of the processing liquid based on a measurement result of the concentration sensor.

3. The substrate processing apparatus of claim 1,
wherein the correction unit corrects the phosphoric acid concentration of the processing liquid based on data indicating a relationship between the phosphoric acid concentration and a silicic acid concentration in the processing liquid when the etching selectivity is of the given value.

4. The substrate processing apparatus of claim 1,
wherein the given value is any value.

5. The substrate processing apparatus of claim 1,
wherein when the processing liquid is used continuously, the correction unit gradually increases the phosphoric acid concentration of the processing liquid such that the etching selectivity becomes constant.

6. The substrate processing apparatus of claim 5,
wherein the substrate processing unit comprises:
an inner tub, having an opening at a top thereof, in which the processing liquid is stored and the one or more substrates are immersed;
an outer tub disposed outside the inner tub, and configured to receive the processing liquid flowing out from the opening; and a gas supply configured to supply an inert gas to bottom portions of the inner tub and the outer tub,
wherein the correction unit gradually increases the phosphoric acid concentration of the processing liquid by controlling an amount of the inert gas supplied to at least one of the inner tub or the outer tub.

7. The substrate processing apparatus of claim 6,
wherein the controller comprises a determination unit configured to make a determination upon, based on the phosphoric acid concentration and a silicic acid concentration of the processing liquid in the inner tub at a time when the etching processing is begun, formation states of the silicon nitride film and the silicon oxide film in each of the one or more substrates, and an amount of the inert gas allowed to be supplied from the gas supply, whether or not an etching processing in which the etching selectivity is maintained constant at the given value from the beginning of the etching processing to the end thereof is allowed to be performed.

8. The substrate processing apparatus of claim 7,
wherein the controller further comprises a setting unit configured to set a new phosphoric acid concentration allowing the etching processing in which the etching selectivity is maintained constant at the given value from the beginning of the etching processing to the end thereof when it is determined by the determination unit that the etching processing in which the etching selectivity is maintained constant at the given value from the beginning of the etching processing to the end thereof is not allowed to be performed.

9. The substrate processing apparatus of claim 7,
wherein the controller further comprises an acquisition unit configured to acquire the formation states of the silicon nitride film and the silicon oxide film in each of the one or more substrates based on a lot ID of a FOUP having a processing recipe on the one or more substrates and a number of the one or more substrates.

10. The substrate processing apparatus of claim 2,
wherein the correction unit corrects the phosphoric acid concentration of the processing liquid based on data indicating a relationship between the phosphoric acid concentration and a silicic acid concentration in the processing liquid when the etching selectivity is of the given value.

11. The substrate processing apparatus of claim 2,
wherein the given value is any value.

12. The substrate processing apparatus of claim 2,
wherein when the processing liquid is used continuously, the correction unit gradually increases the phosphoric acid concentration of the processing liquid such that the etching selectivity becomes constant.

13. A substrate processing method, comprising:
etching one or more substrates each having a silicon nitride film and a silicon oxide film formed on a surface thereof with a processing liquid containing phosphoric acid and a silicic acid compound; and
correcting a phosphoric acid concentration of the processing liquid such that etching selectivity of the silicon nitride film with respect to the silicon oxide film becomes constant at a given value from a beginning of the etching processing to an end thereof.

* * * * *